United States Patent
Strang (10) Patent No.: US 8,877,000 B2
(45) Date of Patent: Nov. 4, 2014

(54) SHOWER HEAD GAS INJECTION APPARATUS WITH SECONDARY HIGH PRESSURE PULSED GAS INJECTION

(75) Inventor: Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 1380 days.

(21) Appl. No.: 10/469,592

(22) PCT Filed: Feb. 26, 2002

(86) PCT No.: PCT/US02/03405
§ 371 (c)(1),
(2), (4) Date: Feb. 17, 2004

(87) PCT Pub. No.: WO02/071463
PCT Pub. Date: Sep. 12, 2002

(65) Prior Publication Data
US 2004/0123803 A1 Jul. 1, 2004

Related U.S. Application Data

(60) Provisional application No. 60/272,452, filed on Mar. 2, 2001.

(51) Int. Cl.
| | |
|---|---|
| C23F 1/00 | (2006.01) |
| C23C 16/50 | (2006.01) |
| C23C 16/52 | (2006.01) |
| C23C 16/455 | (2006.01) |
| C23C 16/509 | (2006.01) |
| H01J 37/32 | (2006.01) |

(52) U.S. Cl.
CPC .......... *C23C 16/45565* (2013.01); *C23C 16/455* (2013.01); *C23C 16/45557* (2013.01); *C23C 16/5096* (2013.01); *H01J 37/3244* (2013.01)
USPC ............ 156/345.26; 156/345.33; 156/345.34; 118/715; 118/697; 216/37; 216/67; 427/569

(58) Field of Classification Search
USPC .......... 156/345.33, 345.34; 118/715; 236/565
See application file for complete search history.

(56) References Cited

U.S. PATENT DOCUMENTS

| | | | | |
|---|---|---|---|---|
| 4,854,263 | A * | 8/1989 | Chang et al. ................... | 118/715 |
| 5,256,174 | A * | 10/1993 | Kai et al. ......................... | 96/116 |
| 5,500,256 | A | 3/1996 | Watabe | |
| 5,643,638 | A * | 7/1997 | Otto et al. ...................... | 427/569 |
| 5,888,907 | A | 3/1999 | Tomoyasu et al. | |
| 5,904,553 | A * | 5/1999 | Passlack et al. ............... | 438/590 |

(Continued)

FOREIGN PATENT DOCUMENTS

| | | |
|---|---|---|
| GB | 2347686 | 9/2000 |
| JP | 40-7226397 | 8/1995 |
| JP | 2000-306884 | 11/2000 |

*Primary Examiner* — Karla Moore
(74) *Attorney, Agent, or Firm* — Oblon, Spivak, McClelland, Maier & Neustadt, L.L.P.

(57) ABSTRACT

A plasma-processing chamber including pulsed gas injection orifices/nozzles utilized in combination with continuous flow shower head injection orifices is described. The continuous flow shower head injection orifices introduce a continuous flow of gas while the pulsed gas injection orifices/nozzles cyclically inject a high-pressure gas into the chamber. In one embodiment, a central computer may monitor and control pressure measurement devices and utilize the measurements to adjust processing parameters (e.g. pulse duration, pulse repetition rate, and the pulse mass flow rate of processing gases).

22 Claims, 7 Drawing Sheets

(56) References Cited

U.S. PATENT DOCUMENTS

| | | | |
|---|---|---|---|
| 5,928,963 A * | 7/1999 | Koshiishi | 438/714 |
| 5,976,261 A | 11/1999 | Moslehi et al. | |
| 6,014,943 A | 1/2000 | Arami et al. | |
| 6,273,954 B2 | 8/2001 | Nishikawa et al. | |
| 6,287,980 B1 * | 9/2001 | Hanazaki et al. | 438/726 |
| 6,511,539 B1 * | 1/2003 | Raaijmakers | 117/102 |
| 6,784,108 B1 * | 8/2004 | Donohoe et al. | 438/706 |
| 2002/0160125 A1 * | 10/2002 | Johnson et al. | 427/569 |

* cited by examiner

SHOWER HEAD GAS INJECTION APPARATUS WITH SECONDARY HIGH PRESSURE PULSED GAS INJECTION

BACKGROUND OF THE INVENTION

1. Field of the Invention

The present invention generally relates to plasma processing of substrates (e.g., semiconductor wafers or LCD panels) and more particularly, to a method of and an apparatus for pulsed gas injection within a plasma process chamber.

2. Discussion of the Background

A number of steps in the manufacture of semiconductor wafers may use plasma processing. For instance, resist-stripping, etching, depositing, and passivating, may use plasma processing to produce integrated circuits (hereinafter "ICs") on a substrate. Because the features of the ICs are so small, a uniform plasma density is required for satisfactory resolution thereof. A high plasma density is also necessary in order to maintain process throughputs within a commercially viable range.

Typically, plasmas are established in low-pressure gas environments by causing electrons to collide with individual atoms or molecules, thereby producing additional free electrons and ions. In order to generate the plasma, radio frequency (hereinafter "RF") power is inductively or capacitively applied to a gas by an inductive or capacitive plasma coupling element, respectively. Examples of inductive coupling elements include conductive, helical, and solenoidal coils that are placed outside of, but in close proximity to, the walls of the process chamber and surround a cylindrically-shaped process chamber. Known inductive plasma generating systems are described in U.S. Pat. No. 5,234,529 (hereinafter "the '529 patent"), issued to Wayne L. Johnson; U.S. Pat. No. 5,534,231 issued to Savas; and U.S. Pat. No. 5,811,022 issued to Savas et al. However, the inductor may also be a planar coil of wire or tubing so as to be placed against the flat top of the cylindrically-shaped process chamber as disclosed in U.S. Pat. No. 5,280,154 issued to Cuomo et al. The coils may be excited by an RF source such that a time varying magnetic field, in accordance with Faraday's Law, becomes associated therewith. The time varying magnetic field produces a time varying electric field that accelerates electrons, and that acceleration enables the plasma to be established as disclosed in U.S. Pat. No. 4,431,898 issued to Reinberg et al.

In capacitively coupled systems, an RF field may be produced between a pair of opposed electrodes, wherein the electrodes are nominally parallel to the surface of the semiconductor wafer(s) to be processed. In fact, the semiconductor wafer(s) to be processed are often located on one of the electrodes. An example of such a plasma processing system is disclosed in U.S. Pat. No. 4,209,357 (hereinafter "the '357 patent"), issued to Gorin et al., which is herein incorporated by reference.

Plasma processors often require at least one feed gas to be introduced into the plasma processing chamber. Conventionally, feed gases are introduced into the plasma chamber through gas inlet tubes which are located around the periphery of the region in which the plasma is to be established. A distribution manifold may also be used to introduce gas into a plasma processing chamber. Examples of such plasma processors are disclosed in the '357 patent, U.S. Pat. No. 5,624,498 issued to Lee et al.; U.S. Pat. No. 5,614,026 issued to Williams; and U.S. Pat. Nos. 5,614,055 and 5,976,308 both issued to Fairburn et al. The contents of all of the above-referenced patents are incorporated herein by reference.

Figure 1:
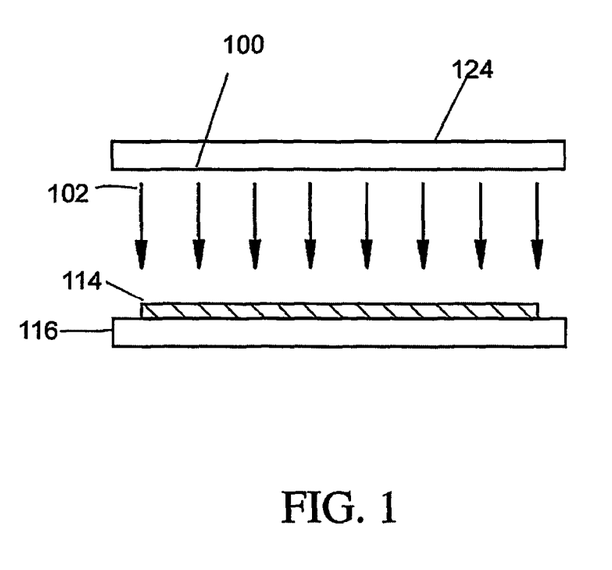
FIG. 1 is a schematic showing a known continuous flow system with continuous shower-head flow.

Feed gas distribution systems of known plasma processors that are fixed and have only low pressure injection with respect to the plasma processing chambers have drawbacks. One such system is shown in FIG. 1 in which continuous gas flow 102 passes through a shower head gas injection system including an array of continuous flow shower head orifices 100 within an upper electrode 124. The gas flow 102 effuses through the shower head orifices into the low-pressure (vacuum) region and interacts with the substrate 114.

A shortcoming of known gas injection systems is the lack of gas directivity, particularly when interacting with the substrate 112. In other words, the gas velocity angular distribution is broad (or the gas velocity directivity is isotropic). In known systems useful for etch processes, a low mass flow rate (i.e. approximately 500 sccm argon equivalent) suitable for a low-pressure process (i.e. 1 to 50 mTorr) is generally preferred. Moreover, known gas injection systems include a shower head including a plurality of (usually 0.5 to 1 mm diameter) injection orifices (typically several hundred orifices). In addition to flow rate and pressure processing conditions, the injection design must be sufficient to affect a uniform gas flow for large substrate areas (e.g., 200 to 300 mm or larger). The combination of the gas injection design and the conditions suitable for etch processes (described above) leads to a low injection total pressure (e.g., of order 1 Torr or less). The injection total pressure refers to the gas pressure within the gas injection cavity upstream of the injection orifices during stagnation conditions. In order to increase the total pressure for gas injection, one must significantly increase the mass flow rate, reduce the number of injection orifices and/or decrease the orifice size; any of which are generally impractical in conventional systems.

Another drawback of known feed gas distribution systems is that the injection systems are not designed with nozzle orifice geometries suitable to constrain the rate of gas expansion into the low pressure vacuum environment.

Yet another drawback of known feed gas distribution systems is the inadequate continuous high mass flow rate (which is necessary to achieve high injection total pressures). This requirement is further exacerbated at lower pressures. At present, state-of-the-art vacuum pumping technology is inadequate to produce a pumping speed at the processing region sufficient to accommodate the necessary high throughputs at low pressure for high pressure injection.

SUMMARY OF THE INVENTION

It is an object of the present invention to provide a method of and an apparatus for pulsing high-pressure gas(es) in a plasma processing system. Preferably the pulses are supersonic with durations shorter than one millisecond and repetition rates greater than 1 kHz. In one such embodiment, gases are only injected using pulses. In an alternate embodiment, pulses are combined with a continuous flow of gases.

It is another object of the present invention to provide a pressure gradient local to a substrate surface. During the short high pressure pulses, the gas flow is temporarily directed normal to the wafer surface under high pressure resulting in an increase in the pressure within a thin layer adjacent to the wafer surface and a more narrow distribution of the gas velocity directivity near the wafer surface. This increases the number of adatoms at the wafer surface and increases the probability of finding a specific adatom moving in a direction normal to the surface.

In one embodiment of the present invention, a high pressure nozzle throat includes a conically divergent section that undergoes a diameter increase to restrain the rate of gas expansion into the low pressure environment of the plasma processing chamber.

It is yet another object of the present invention to have a computer monitoring and controlling pressure measurement devices and utilizing the measurements to adjust at least one processing parameter (e.g., pulse duration, pulse repetition rate, and pulse mass flow rate).

BRIEF DESCRIPTION OF THE DRAWINGS

A more complete appreciation of the present invention and many of the attendant advantages thereof will become readily apparent with reference to the following detailed description, particularly when considered in conjunction with the accompanying drawings, in which.

DETAILED DESCRIPTION OF THE PREFERRED EMBODIMENTS

Figure 2:
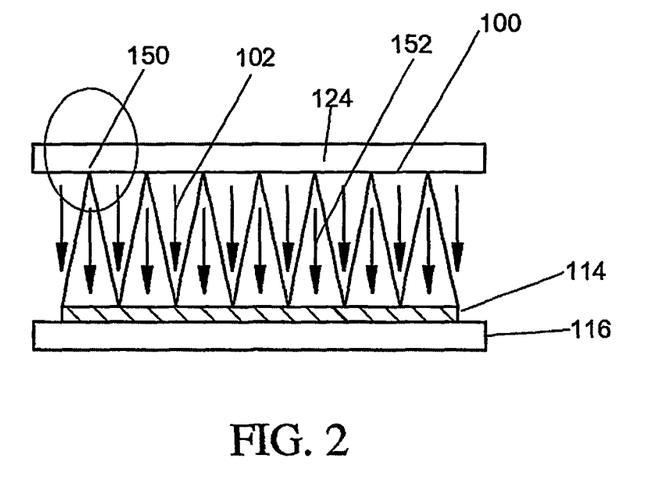
FIG. 2 is a schematic showing a hybrid flow system including pulsed supersonic injection interlaced with continuous shower-head flow.

Referring now to the drawings, in which like reference numerals designate identical or corresponding parts throughout the several views; FIG. 2 illustrates a continuous flow 102 from an array of shower head orifices 100 within an upper electrode 124 toward a substrate 114 on a lower electrode 116. In the preferred embodiment, pulsed injection orifices or nozzles 150 are interlaced within the array of continuous flow shower head orifices 100 (e.g., in a 1:2 ratio). During periods when gas is flowing through only the continuous flow shower head orifices 100, the stationary (or steady-state) pressure field exhibits only spatial gradients which includes primarily radial gradients in its magnitude across the substrate 114. This is due in part to the close spacing of the upper 124 and the lower 116 electrodes. Pulsing the gas through pulsed gas injection orifices/nozzles, in addition to continuously flowing gas through the shower head orifices 100, leads to a non-stationary pressure field. As will be described with reference to FIG. 3A, the array of pulsed gas injection orifices or nozzles 150 and the array of continuous flow shower head orifices are preferably each independently controlled. (In fact, each array can be broken into sub-arrays which can also be independently controlled.) Each array (or sub-array) can be independently connected to a separate gas supply and, therefore, the flow properties to each array (or sub-array) of orifices or nozzles may be varied. For example, the flow properties may include any one or more of the following: injection total pressure, mass flow rate, gas specie(s) composition. Moreover, using plural independently controlled gas feeds, high and low pressure gas(es) can be driven through the "pulsed" injection orifices in an alternating fashion to obviate the need for continuous flow shower head orifices.

In the preferred embodiment, process gas(es) enter the process chamber from two sources as described above; however, it need not be limited to two sources, it may be two or more gas sources. From the first gas source, a continuous gas flow 102 enters the process chamber through a first array of shower head orifices 100. From the second gas source, a pulsed gas flow 152 periodically enters the process chamber through a second array of orifices or nozzles during a period of time comparable with the pulse width (or the period of time between which the pulse valve is open and closed). During the periods of gas pulsing (open pulse valve), the interaction of the gas with the substrate 114 is substantially different than during times when the gas is not pulsed (closed pulse valve). In fact, during periods of (high pressure) gas pulsing, the gas transport can be substantially different adjacent to the surface of the substrate 114 and, in general, can affect a more narrow distribution of the gas velocity directivity near the surface of the substrate 114, an increase in the local number density, or a combination thereof depending upon the process pressure. The combination of (1) increasing the number of adatoms (i.e., the chemical specie to be deposited on the wafer surface) at the wafer surface and/or (2) increasing the probability of finding a specific adatom moving in a direction normal to the surface can lead to improved deposition within high aspect ratio features as well as improved etch process performance.

Figure 3A:
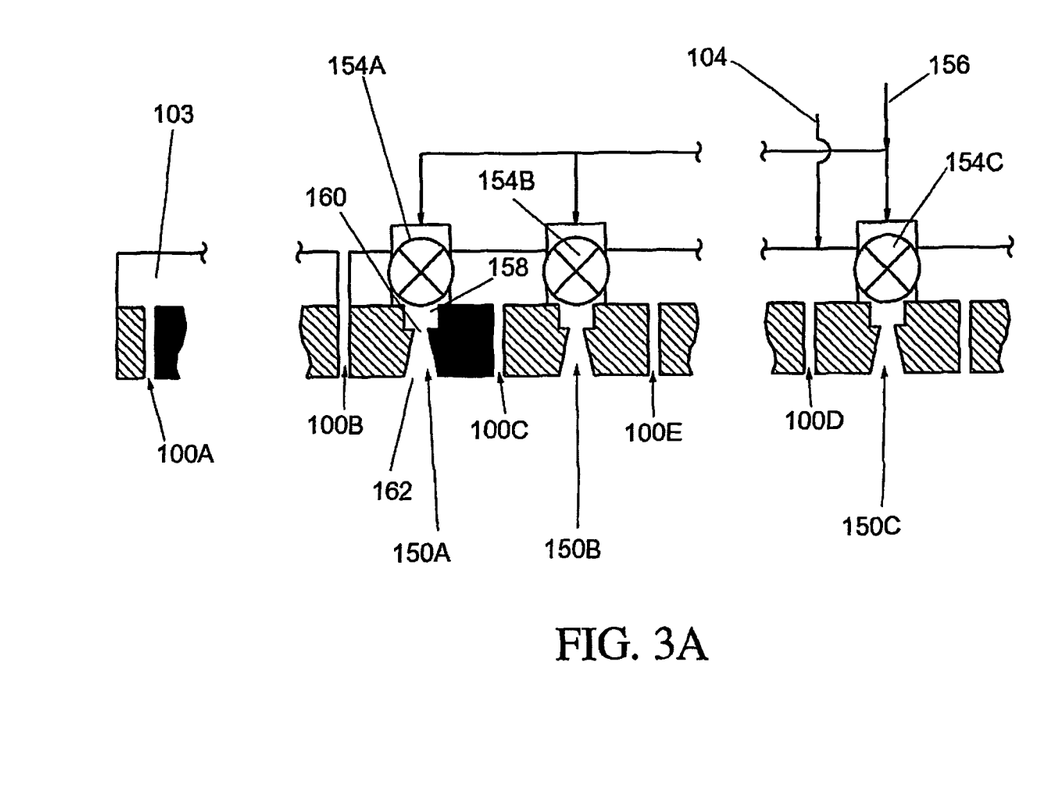
FIG. 3A is an enlarged view of FIG. 2 showing a cross-section of a pulsed orifice/nozzle inserted between continuous flow shower-head orifices.

With reference now to FIG. 3A, the gas injection system includes an array of continuous flow shower head orifices 100 and an array of pulsed gas injection orifices/nozzles 150 as shown in cross-section. The array of continuous flow shower head orifices 100 includes a plurality of cylindrical orifices 100A, 100B, 100C, . . . ; each of which are pneumatically connected to a common volume referred to as the shower head injection cavity 103. The shower head injection cavity 103 is, in turn, pneumatically connected to a first gas supply (not shown) through a first gas supply line 104. Each orifice (100A, 100B, 100C, . . . ) in the continuous flow shower head array 100 facilitates a continuous flow of gas 102 into the process chamber. Therein, the pressure in shower head injection cavity 103, the mass flow rate to shower head injection cavity 103 and/or the gas composition of the gas delivered to shower injection cavity 103 may be varied. The array of pulsed gas injection orifices/nozzles 150 includes a plurality of cylindrically symmetric gas orifices or nozzles 150A, 150B, 150C, . . . , each of which is pneumatically connected to a second gas supply (not shown) through a respective pulsed gas valve 154A, 154B, 154C, . . . , and gas supply line 156. Each pulsed gas orifice/nozzle (150A, 150B, 150C, . . . ) facilitates a pulsed flow of gas 152 into the process chamber. Individually, a pulsed gas injection orifice or nozzle (e.g. 150A) includes an orifice/nozzle entry region 158 and an orifice/nozzle throat 160. The orifice/nozzle throat 160 consists of the minimum-area cross-section for the orifice/nozzle. And furthermore, the gas pressure, gas composition, gas flow rate, duration of gas admission to each orifice/nozzle entry region 158 and/or the frequency at which gas is admitted to each orifice/nozzle entry region 158 can be varied.

With continuing reference to FIG. 3A, the array of continuous flow shower head orifices 100 continuously inject process gas (e.g., $C_4F_8$) diluted with an inert gas (e.g., Argon) into the vacuum chamber processing region. An exemplary gas specie process recipe can include 300 sccm argon, 5 sccm $C_4F_8$ and 10 sccm oxygen. Conversely, the total gas flow through the array of pulsed gas injection orifices/nozzles 150 could be correspondingly scaled to the equivalent flow rates of the order 1000-10000 sccm during short time durations in order to produce total pressures preceding the gas injection orifice/nozzle in the orifice/nozzle entry region 158 of the order of several Torr to several hundreds of Torr (e.g., 1 to 1000 Torr in the exemplary embodiment). Pulsed gas injection may be accomplished using modified auto fuel injector valves or pulsed piezo-electric valves (e.g. piezo-electric actuated micro-machined valve). See, for example, Cross & Valentini 1982, Bates & Burell 1984 and Gentry & Giese 1978, the contents of which are incorporated by reference. The pulsed injection heads preferably provides supersonic pulse durations shorter than a millisecond with repetition rates greater than 1 kHz.

The flow of gas 152 through the array of pulsed gas injection orifices/nozzles 150 can exhibit steady-state behavior within the orifice/nozzle during a portion of the gas pulse when the minimum pulse time exceeds the sum of the time required to accelerate the gas from a stagnant condition to a sonic condition, the time required to establish a region of a sufficient number of molecules to undergo the expansion, and the time sufficiently long that the pulse density is unaffected by the velocity dispersion at the beginning and the end of the pulse (Saenger 1981). For those of ordinary skill in the art, the above guideline presents the relationship between the pulsed gas injection orifice/nozzle size/geometry and the pulse width for optimal control of the pulsed gas injection dynamics. For example, at a total pressure of approximately 200 Torr, the minimum pulse time is approximately 10 microseconds.

With continuing reference to FIG. 3A, the pulsed gas injection orifice/nozzle 150A, (150B, 150C, . . . ) includes an orifice/nozzle throat 160, and a conically divergent exit portion 162. In the preferred embodiment, an exemplary diameter of the orifice/nozzle throat 160 can be approximately 0.5 millimeters. Beyond the throat 160, the conically divergent exit portion 162 undergoes a diameter increase with an exit diameter ratio de/d* (e.g. de/d*≈1 to 10, and preferably ≈2 to 4). The purpose of the conical exit portion section 162 is to restrain the rate at which gas expands into the low pressure process region. The conical section may be replaced with a concave section (not shown), particularly a smooth wall contour designed using the method of characteristics (i.e., a "perfect" nozzle or "minimum-length" nozzle). Conversely, the pulsed gas injection orifice/nozzle may be simply a cylindrical orifice excluding the divergent section following the orifice/nozzle throat 160.

Figure 3B:
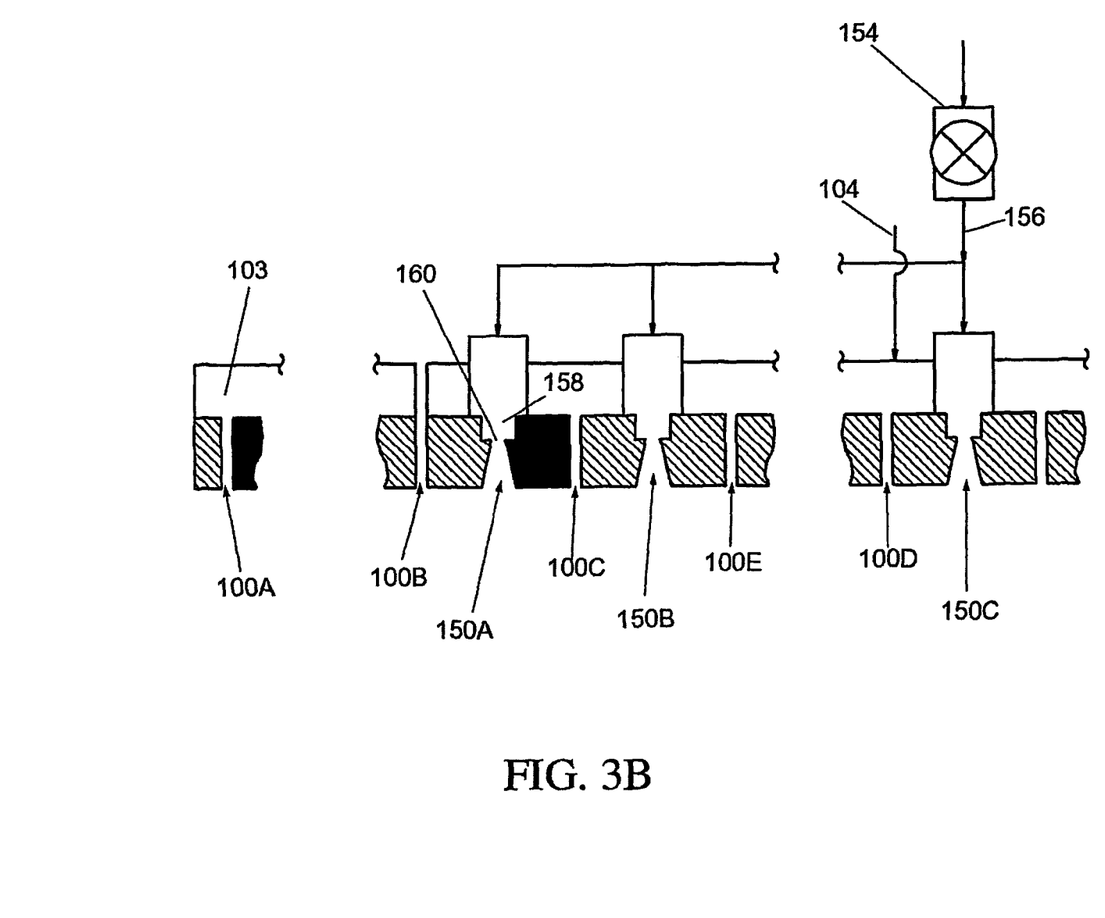
FIG. 3B is a cross-section of a pulsed orifice/nozzle inserted between continuous flow shower-head orifices and a pulsed gas valve.
Figure 3C:
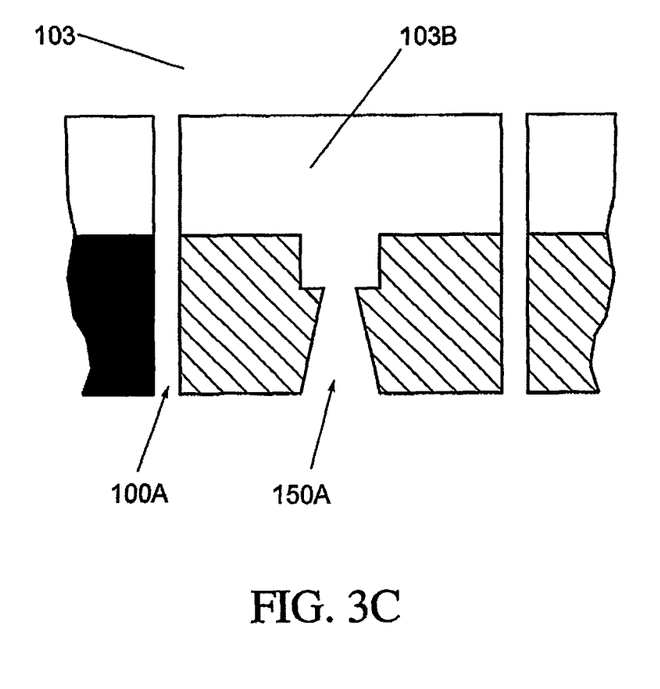
FIG. 3C is an enlarged cross-section of a pulsed orifice/nozzle.

With reference now to FIG. 3B, the gas injection system comprises an array of continuous flow shower head orifices 100 and an array of pulsed gas injection orifices/nozzles 150 as shown in cross-section. The array of continuous flow shower head orifices 100 comprises a plurality of cylindrical orifices 100A, 100B, 100C, . . . ; each of which are pneumatically connected to a common volume referred to as the shower head injection cavity 103. The shower head injection cavity 103 is, in turn, pneumatically connected to a first gas supply (not shown) through a first gas supply line 104. Each orifice (100A, 100B, 100C, . . . ) in the continuous flow shower head array 100 facilitates a continuous flow of gas 102 into the process chamber. Therein, the pressure in shower head injection cavity 103, the mass flow rate to shower head injection cavity 103 and/or the gas composition of the gas delivered to shower injection cavity 103 may be varied. The array of pulsed gas injection orifices/nozzles 150 comprises a plurality of cylindrically symmetric gas orifices or nozzles 150A, 150B, 150C, . . . , each of which is pneumatically connected to a second gas supply (not shown) through a single pulsed gas valve 154, gas supply line 156 and gas distribution (plumbing) manifold to connect the output of the single pulse valve 154 to the entry region 158 of each orifice/nozzle. Moreover, the gas distribution manifold shown in FIG. 3B may be a common volume 103B as shown in FIG. 3C that is pneumatically connected to every orifice/nozzle, wherein the common volume 103B is further connected to the output of the pulsed gas valve via a single gas supply line. An exemplary pneumatically-activated valve, suitable for pulsing the gas as shown in FIG. 3B, is a Nupro SS-BNVCR4-C. Moreover, the pneumatically-activated valve may be opened or closed via activation from an electro-mechanical valve (e.g., SMC VQ-110U-5F). Each pulsed gas orifice/nozzle (150A, 150B, 150C, . . . ) facilitates a pulsed flow of gas 152 into the process chamber. Individually, a pulsed gas injection orifice or nozzle (e.g., 150A) comprises an orifice/nozzle entry region 158 and an orifice/nozzle throat 160. The orifice/nozzle throat 160 consists of the minimum-area cross-section for the orifice/nozzle. And furthermore, the gas pressure, gas composition, gas flow rate, duration of gas admission to each orifice/nozzle entry region 158 and/or the frequency at which gas is admitted to each orifice/nozzle entry region 158 can be varied.

Figure 4:
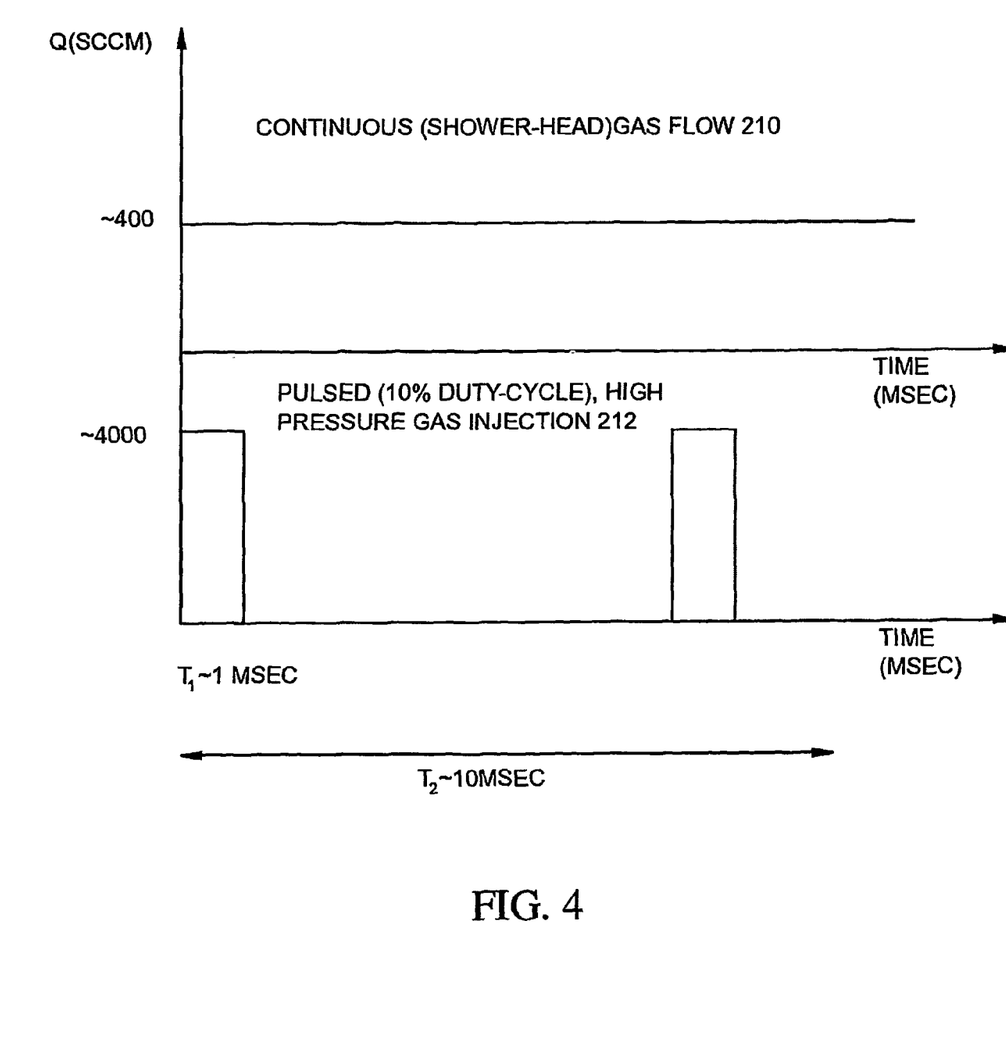
FIG. 4 is a graphical representation of time and pressure showing injection conditions for the array of the shower head orifices and the array of pulsed gas injection orifices/nozzles.

FIG. 4 illustrates a graph of the injection conditions for the array of continuous flow shower head orifices 100 and the array of (high pressure) pulsed gas injection orifices/nozzles 150. The array of continuous flow shower head orifices 100 receives a continuous flow 210 of gas with an equivalent total mass flow rate of argon of, for example, approximately 400 sccm, whereas the array of high-pressure) pulsed gas injection orifices nozzles 150 receive periodic short pulses of gas 212 with an equivalent total mass flow rate of argon at approximately, for example, 4,000 sccm. The pulse duration is shown to be, for example, 1 msec of time while the pulse repetition rate is shown to be, for example, 1 pulse per 10 msec or 100 Hz (i.e., 10% duty cycle). Moreover, in using conventional turbo-molecular vacuum pumps in standard vacuum design practice, one can achieve a pumping speed at the processing region in excess of S=1000 liters/sec (not exceeding the state of the art vacuum pumping speed of approximately 5,000 liters/sec). The typical processing volume in a narrow space parallel plate capacitively coupled plasma reactor is approximately V=1 liter (i.e., an electrode diameter of 25.4 cm and an electrode spacing of 1.5-2.5 cm). Therefore, the processing region evacuation time can be expected to be approximately V/S=1 msec, which is consistent with the pulse duration in FIG. 4.

Referring again to FIG. 4, the apparatus described in FIG. 3B is suitable for a pulse duration of order 100 msec to 1 sec and a corresponding pulse repetition period of 1 to 10 sec. In FIG. 3A, the close proximity of the pulsed gas injection valves to the orifice/nozzle entry and, subsequently, the vacuum chamber, facilitates short pulse widths (i.e. 1 msec) and higher pulse rates (i.e. 100 Hz).

Figure 5:
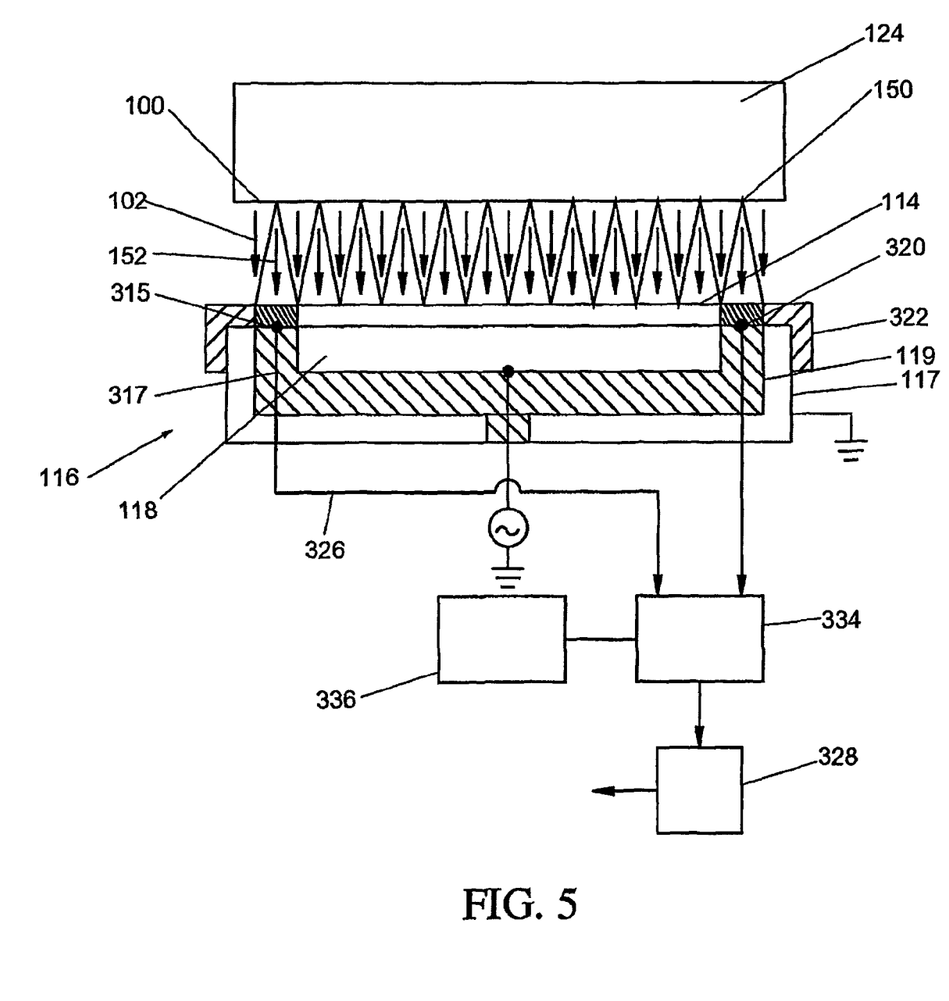
FIG. 5 is a schematic cross-section of a parallel plate reactor having an upper electrode and a lower electrode with continuous shower head flow through continuous flow shower head orifices and pulsed gas injection through pulsed gas injection orifices/nozzles.

FIG. 5 illustrates a parallel plate reactor having an upper electrode 124 and a lower electrode 116 with continuous shower head flow 102 through the array of continuous flow shower head orifices 100 and pulsed gas injection 152 through the array of (high-pressure) pulsed gas injection orifices/nozzles 150. The substrate 114 sets atop a RF biasable lower electrode (LEL) 116 (for example, comprising ground plate 117, RF electrode 118 and dielectric 119) and is clamped to the electrode via an electrostatic clamp (not shown). The substrate 114 resides within a focus ring 320, and generally an LEL shield ring 322 which is utilized to protect the LEL 116 periphery from the processing plasma.

Additionally in FIG. 5, a measurement system is shown that may be utilized for monitoring the surface pressure, particularly on the surface of the focus ring 320. The measurement system consists of the pneumatic connection 326 of several holes 315 in the focus ring 320 (hole diameter 1/16 inch), at a plurality of locations azimuthally placed about the periphery of the substrate 114 to a distribution manifold 334 via machine holes in the LEL 116 and stainless steel (or aluminum) tubing 317. The distribution manifold 334 has an array of pneumatically activated (normally closed) valves and a manifold on the output of the array of valves for pneumatically connecting a single measurement site to a single pressure measurement device 328 (e.g. pressure manometer, semiconductor strain gauge, etc.). An exemplary pressure manometer is a MKS 627B-11T_AC1B. An exemplary pneumatically-activated valve is a Nupro SS-BNVCR4-C. Moreover, the array of pneumatically-activated valves in the distribution manifold 334 may be opened or closed via activation from an array of electro-mechanical valves (i.e. SMC VQ-110U-5F). The array of electro-mechanical valves permits the passage of high-pressure gas (i.e. nitrogen) to open a specific valve. An alternative embodiment would be to individually (pneumatically) connect each measurement site to its own pressure measurement device.

The operation of the valves and the pressure measurement devices may be directed by a central controller or computer 336. Therefore, a central computer may monitor the pressure measurement sites 315 and control the pressure measurement devices 328 and utilize the measurement to adjust the pulse duration, pulse repetition rate, pulse mass flow rate, etc. Depending on the time response of the system, time-resolved measurements of various duration may be used (e.g., 100 msec to more than one second). For optimal time response, each measurement site should be pneumatically connected 326 to an individual pressure measurement device 328 (and the pneumatic connection should be as short as mechanically possible). At minimum, for short pulse duration, the measurement device 328 can monitor the surface pressure in an average sense (averaging both the period of high surface pressure and the chamber pressure). However, in an alternate embodiment, multiple sites can utilize the same measurement device 328 in a multiplexed fashion.

It is further possible to reduce the valve cycling times needed to open and close the low and high pressure gases (e.g., when attempting to cycle quickly). In one embodiment, plural valves (or sets of valves) are opened and closed at different phases. For example, when utilizing two valves, the first and second valves are opened and closed at the same frequency but 180 degrees out of phase. In a four-valve system, the four valves can be opened and closed with the same frequency but each valve being 90 degrees out of phase with all the rest. That is, the first opens at 0 degrees, the next at 90 degrees, the next at 180 degrees, and the last at 270 degrees. An increasing number of valves can be used as necessary to meet the cycle and pressure requirements. Similarly just as individual valves can be opened at various phases, sets of valves can be opened at the same phases.

Numerous modifications and variations of the present invention are possible in light of the above teachings. It is therefore to be understood that, within the scope of the appended claims, the present invention may be practiced otherwise than as specifically described herein.

The invention claimed is:

1. A plasma processing system comprising:
   a plasma processing chamber including a plurality of continuous flow shower-head orifices;
   plural pulsed high-pressure injectors interspersed between the plurality of continuous flow shower-head orifices;
   said plural pulsed high-pressure injectors each being separately connected to a gas feed line;
   said plurality of continuous flow shower-head orifices being connected to a common volume;
   at least one continuous flow gas valve configured to provide a first gas to the chamber via the common volume and the continuous flow shower head orifices;
   at least one pulsed gas valve configured to provide a second gas to the chamber via at least one of the gas feed lines and its respective pressure injector; and
   a controller coupled to each gas valve and programmed to cause the continuous flow gas valve to provide the first gas in a continuous flow having a flow rate of 100-500 sccm and to cause the pulsed gas valve to provide the second gas in a pulsed flow, each pulse having a flow rate of 1,000-10,000 sccm such that, during each pulse, gas transport adjacent to a surface of a substrate being processed affects at least one of an increase in local number density of adatoms, or an increase in probability of adatoms moving in a direction normal to the surface, to improve processing within high aspect ratio features in the substrate.

2. The plasma processing chamber as claimed in claim 1, wherein the plural pulsed high-pressure injectors further comprise:
   a continuous diameter upper neck portion; and
   a conically divergent pressure restraining exit portion with increasing diameter for distributing at least one processing gas into said plasma processing chamber.

3. The plasma processing chamber as claimed in claim 1, wherein said each pulsed high-pressure injector has a concave shaped exit portion.

4. The plasma processing chamber as claimed in claim 1, wherein the continuous flow shower-head gas injectors produce a continuous flow of a mixture of processing gases and inert gases.

5. The plasma processing chamber as claimed in claim 1, wherein the plural pulsed high-pressure injectors comprise nozzles injecting gas on the order of 1000 to 5000 sccm.

6. The plasma processing chamber as claimed in claim 1, wherein short high-pressure pulses temporarily direct gas flow normal to the plasma surface resulting in increased pressure within a thin layer adjacent to the said plasma surface.

7. The plasma processing chamber as claimed in claim 1, wherein, said short high-pressure injections increase the number of adatoms at said wafer surface and increase probability of finding a specific adatom moving in a direction normal to said surface; improving deposition and etch process performance.

8. The plasma processing chamber as claimed in claim 1, further comprising:
   a substrate holder;
   a focus ring;
   a pressure manometer;
   a shield ring; and
   an array of pneumatically activated valves for connecting at least one measurement site to the pressure manometer.

9. The plasma processing chamber as claimed in claim 8, further comprising a computer for receiving an output of the pressure manometer for controlling a process of the plasma process chamber.

10. The plasma processing chamber as claimed in claim 9, wherein the computer further comprises software for controlling at least one of a pulse duration, a pulse repetition rate, and a pulse amass flow rate of at least one of the continuous flow shower-head orifices and the plural pulsed high-pressure injectors.

11. The plasma processing chamber of claim 1, wherein said plural pulsed high-pressure injectors each have a first orifice structure and said plurality of continuous flow shower-head orifices each have a second structure different from the first structure.

12. The plasma processing chamber of claim 11, wherein said first structure includes a conically divergent exit portion, and said second structure is a cylindrical structure.

13. The plasma processing chamber of claim 1, wherein said plural pulsed high pressure injectors are connected to a common pulsed gas valve.

14. The plasma processing system of claim 1, wherein said controller is further programmed to cause the pulsed gas valve to pulse the flow of second gas at a pulse duration of less than 1 ms and a pulse rate of greater than 1 kHz.

15. A method for supplying at least one gas to a plasma-processing chamber, the method comprising the steps of:
   injecting a first gas continuously from a continuous shower-head orifice at a gas flow rate of between 100-500 sccm;
   pulsing a second gas cyclically from pulsed high-pressure injectors at a cyclical flow rate of 1,000-10,000 sccm such that, during each pulse, gas transport adjacent to a surface of a substrate being processed affects at least one of an increase in local number density of adatoms, or an increase in probability of adatoms moving in a direction normal to the surface, to improve processing within high aspect ratio features in the substrate; and
   processing a substrate in the plasma processing chamber in a presence of the continuously injected gas and the pulsed gas.

16. The method as claimed in claim 15, further comprising:
   measuring a pressure above the substrate surface at plural measurement sites; and
   processing the measured pressure in a computer to control at least one of a pulse duration, a pulse repetition rate, and a pulse mass flow rate of at least one of the injecting and pulsing steps.

17. The method as claimed in claim 15, further comprising the step of creating a high-pressure area in an area adjacent to the substrate in synchronization with the pulsing step.

18. The method as claimed in claim 15, wherein the step of injecting the gas comprises injecting a combination of plural gases.

19. The method as claimed in claim 15, wherein the step of processing comprises at least one of: (1) etching a surface of the substrate and (2) depositing on a surface of the substrate.

20. The method of claim 15 wherein said injecting comprises injecting a gas continuously from a continuous shower-head orifice without substantially constraining a rate of expansion of the continuous gas; and
   said pulsing comprises pulsing a gas cyclically from pulsed high pressure injectors while constraining a rate of expansion of the pulse gas.

21. The method of claim 15, wherein said pulsing the second gas comprises pulsing the second gas at a cyclical flow rate of 1,000-5,000 sccm.

22. The method of claim 15, wherein said pulsing the second gas comprises pulsing the second gas at a pulse duration of less than 1 ms and a pulse rate of greater than 1 kHz.

* * * * *